United States Patent
Sexton et al.

(10) Patent No.: US 6,274,057 B1
(45) Date of Patent: Aug. 14, 2001

(54) METHOD FOR ETCH FORMATION OF ELECTRICAL CONTACT POSTS ON A CHARGE PLATE USED FOR INK JET PRINTING

(75) Inventors: Richard W. Sexton, Huber Heights; James E. Harrison, Jr., Dayton, both of OH (US)

(73) Assignee: Scitex Digital Printing, Inc., Dayton, OH (US)

( * ) Notice: Subject to any disclaimer, the term of this patent is extended or adjusted under 35 U.S.C. 154(b) by 0 days.

(21) Appl. No.: 09/251,883

(22) Filed: Feb. 17, 1999

(51) Int. Cl.[7] .............................. H01B 13/00; C25D 5/02; B41J 2/07
(52) U.S. Cl. .................. 216/27; 216/13; 216/51; 205/135; 205/221; 347/74; 347/76
(58) Field of Search ............................. 216/13, 14, 17, 216/27, 51; 205/135, 221; 347/74, 76

(56) References Cited

U.S. PATENT DOCUMENTS

| | | | |
|---|---|---|---|
| 3,986,939 | * 10/1976 | Prest | 204/15 |
| 4,560,991 | * 12/1985 | Schutrum | 346/75 |
| 4,902,607 | * 2/1990 | Lee | 430/323 |
| 5,118,386 | * 6/1992 | Kataoka et al. | 216/13 |
| 5,307,561 | * 5/1994 | Feigenbaum et al. | 29/846 |
| 5,364,277 | * 11/1994 | Crumly et al. | 439/67 |
| 5,512,117 | * 4/1996 | Morris | 156/155 |

FOREIGN PATENT DOCUMENTS 10-206462 * 8/1998 (JP) .

* cited by examiner

Primary Examiner—Randy Gulakowski
Assistant Examiner—J. Smetana
(74) Attorney, Agent, or Firm—Barbara Joan Haushalter

(57) ABSTRACT

Metallic bumps are formed for electrical interconnection between the charge plate and the charge drive electronics. This is achieved by having improved electrical connection between an ink jet charge plate and associated charge leads is promoted. First, a mask is aligned to permit plating of an etch mask on the charge plate coupon on the side opposite the charge plate circuitry, so as to place masked regions directly across the coupon from the contact pads of the charge plate circuitry. All the copper alloy charge plate coupon is then etched away except the small portions between the termination and the etch mask. The bump thus formed is used to provide a high pressure point electrical connection to the charge plate.

8 Claims, 7 Drawing Sheets

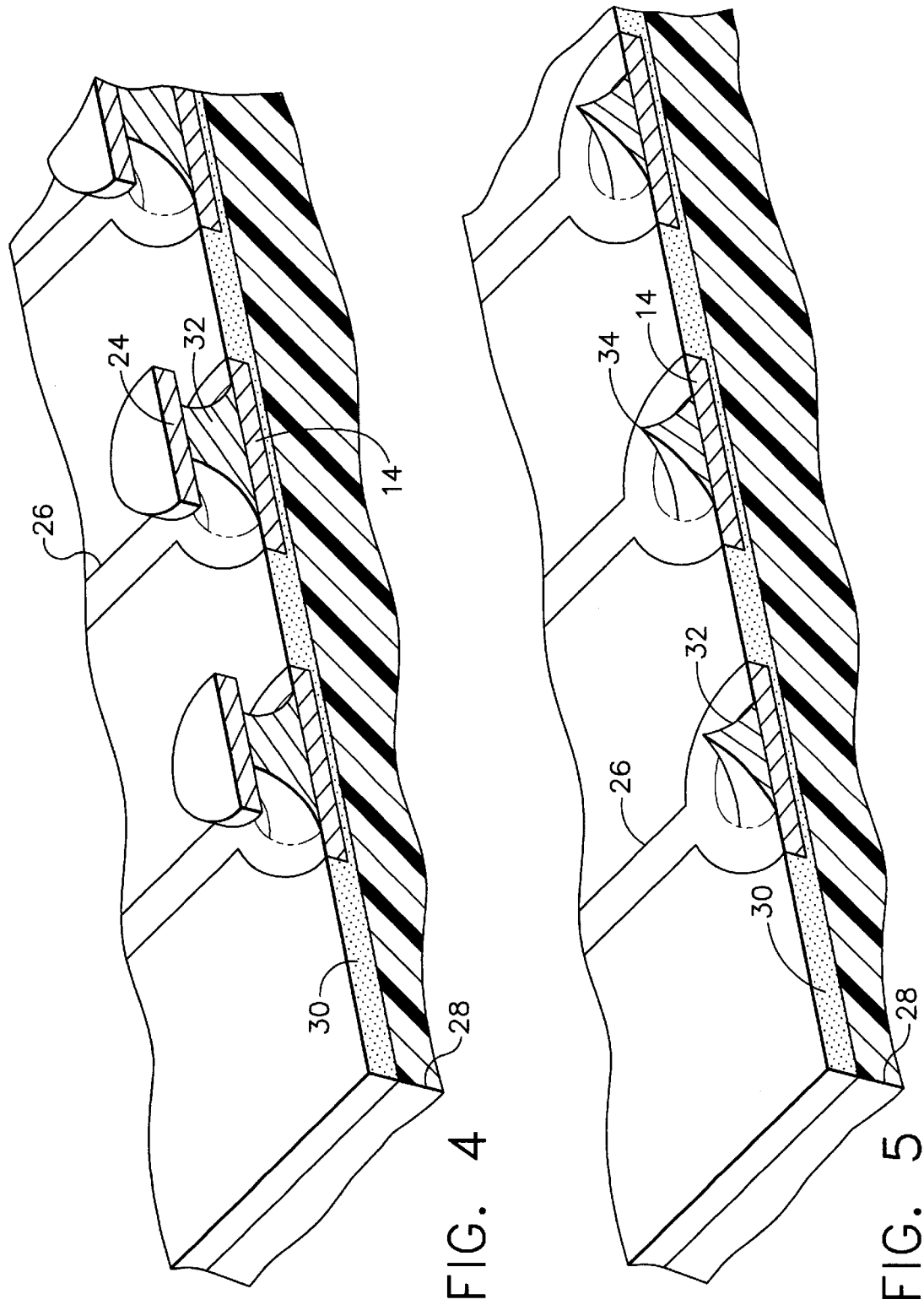

METHOD FOR ETCH FORMATION OF ELECTRICAL CONTACT POSTS ON A CHARGE PLATE USED FOR INK JET PRINTING

TECHNICAL FIELD

The present invention relates to continuous ink jet printers and more particularly to improved construction for the charge plate and electrical connection thereto in such printers.

BACKGROUND ART

In continuous ink jet printing, ink is supplied under pressure to a manifold that distributes the ink to a plurality of orifices, typically arranged in linear array(s). The ink is expelled from the orifices in jets which break up due to surface tension in the ink into droplet streams. Ink jet printing is accomplished with these droplet streams by selectively charging and deflecting some droplets from their normal trajectories. The deflected or undeflected droplets are caught and re-circulated and the others are allowed to impinge on a printing surface.

Drops are charged by a charge plate having a plurality of charging electrodes along one edge, and a corresponding plurality of connecting leads along one surface. The edge of the charge plate having the charging electrodes is placed in close proximity to the break off point of the ink jet filaments, and charges applied to the leads to induce charges in the drops as they break off from the filaments. U.S. Pat. No. 5,512,117, issued Apr. 30, 1996 to Morris, describes one method of fabricating a charge plate. The charge plate taught by Morris is fabricated by electro-depositing the charging electrodes and leads on a flat sheet of etchable material, such as copper foil, to form a so-called "coupon." The coupon is bent in a jig at approximately a 90° angle. The leads are then bonded or laminated to a charge plate substrate, and the etchable material is removed.

In high resolution printhead making interconnects from the charge plate to the charge driver electronics becomes problematic. Electrical connection to planar charge plate lead terminations pose a problem in that the contact pads are positioned in a dense pattern and it is difficult to make assured contact to all the pads with a multi-pad connector, such as those using anisotropic epoxy or elastomeric connectors as described in U.S. Pat. No. 5,459,500. While these connections have been effective for longer arrays or higher density arrays, the pressure which must be supplied to provide contact can produce bowing of the charge plate. As a result of the bowing, contact pads in the center of the connector can have insufficient pressure applied to ensure that contact is made. Solder connections also have problems as the solder connectors tend to form bridges between adjacent leads when the solder is reflowed over a planar circuit.

As discussed in co-pending, commonly assigned application Ser. No. 09/211,212, raised bump contacts on the mating flex cable can be used to provide connection to the charging electrodes with low clamping forces, minimizing the bow of the catcher and charge plate. In practice however it has been found that the fabrication of flex cables having the desired raised bump contacts, using the prior art methods such as those found in U.S. Pat. Nos. 5,364,277 and 5,307,561, are very difficult to fabricate at the desired resolutions.

A need has therefore been identified for an improved technique for electrical connection to ink jet charge plates.

SUMMARY OF THE INVENTION

It is the object of the present invention to provide an improved technique for forming high pressure-point columns or bumps for making reliable spring force electrical contacts on an ink jet charge plate.

In accordance with one aspect of the present invention, metallic bumps are formed for electrical interconnection between the charge plate and the charge drive electronics. This is achieved by applying the teachings of the present invention wherein improved electrical connection between an ink jet charge plate and associated charge leads is promoted. First, a mask is aligned to permit plating of an etch mask on the charge plate coupon on the side opposite the charge plate circuitry, so as to place masked regions directly across the coupon from the contact pads of the charge plate circuitry. All the copper alloy charge plate coupon is then etched away except the small portions between the termination and the etch mask. The bump thus formed is used to provide a high pressure point electrical connection to the charge plate.

Other objects and advantages of the invention will be apparent from the following description and the appended claims.

BRIEF DESCRIPTION OF THE DRAWING

FIG. 4 is an enlarged cutaway view as in FIG. 3, after the electroforming substrate is etched away to produce the raised contact pads;

FIG. 5 is an enlarged cutaway view as in FIG. 4, after the electroforming substrate is overetched to remove the etch mask, producing a sharply pointed contact pad;

DETAILED DESCRIPTION OF THE INVENTION

The present invention proposes a technique for forming columns or bumps on the electrical contact pads of an ink jet printer charge plate. These high-pressure points concentrate the clamping pressure on the electrical contact pads to provide reliable electrical contacts to the ink-jet charge plate without causing the charge plate to bend excessively due to the clamping force. The fabrication of the raised bumps on the charge plate can eliminate the need for fabricating raised bumps on the flex cable. By eliminating the raised bumps from the flex cable, their fabrication can be greatly simplified. This is particularly advantageous as finer pitch assemblies are applied in the ink jet art.

The charge plate is fabricated by a process such as is outlined in U.S. Pat. Nos. 5,512,117 and 4,560,991, both totally incorporated herein by reference. Charge plate electrodes can be formed by an electroforming process. Electroforming of charge plate electrodes requires a thin copper alloy substrate upon which the charge plate electrodes are plated. Using a photolithographic process, portions of the substrate are covered or masked by photoresist. The back side of the substrate, the side not containing the electrode pattern, is also masked by photoresist or some other suitable masking material to prevent electroforming metal on the back side of the substrate. The pattern of the charge electrodes can then be electroformed on those areas of the substrate not masked by the photoresist. After the electroforming process, the photoresist used as a electroforming mask is removed. The coupon (the copper alloy substrate with the electroformed leads) is bent in a jig at approximately a 90° angle. An adhesive layer is applied between the charge plate coupon and the charge plate substrate and the coupon is then laminated to one side and one edge of a charge plate substrate. Finally, the copper alloy material is removed by an etching process. As the adhesive layer fills the space between the electroformed leads during the lamination process, the surface of the leads lies in the same plane as the rest of the charge plate surface.

Figure 1:
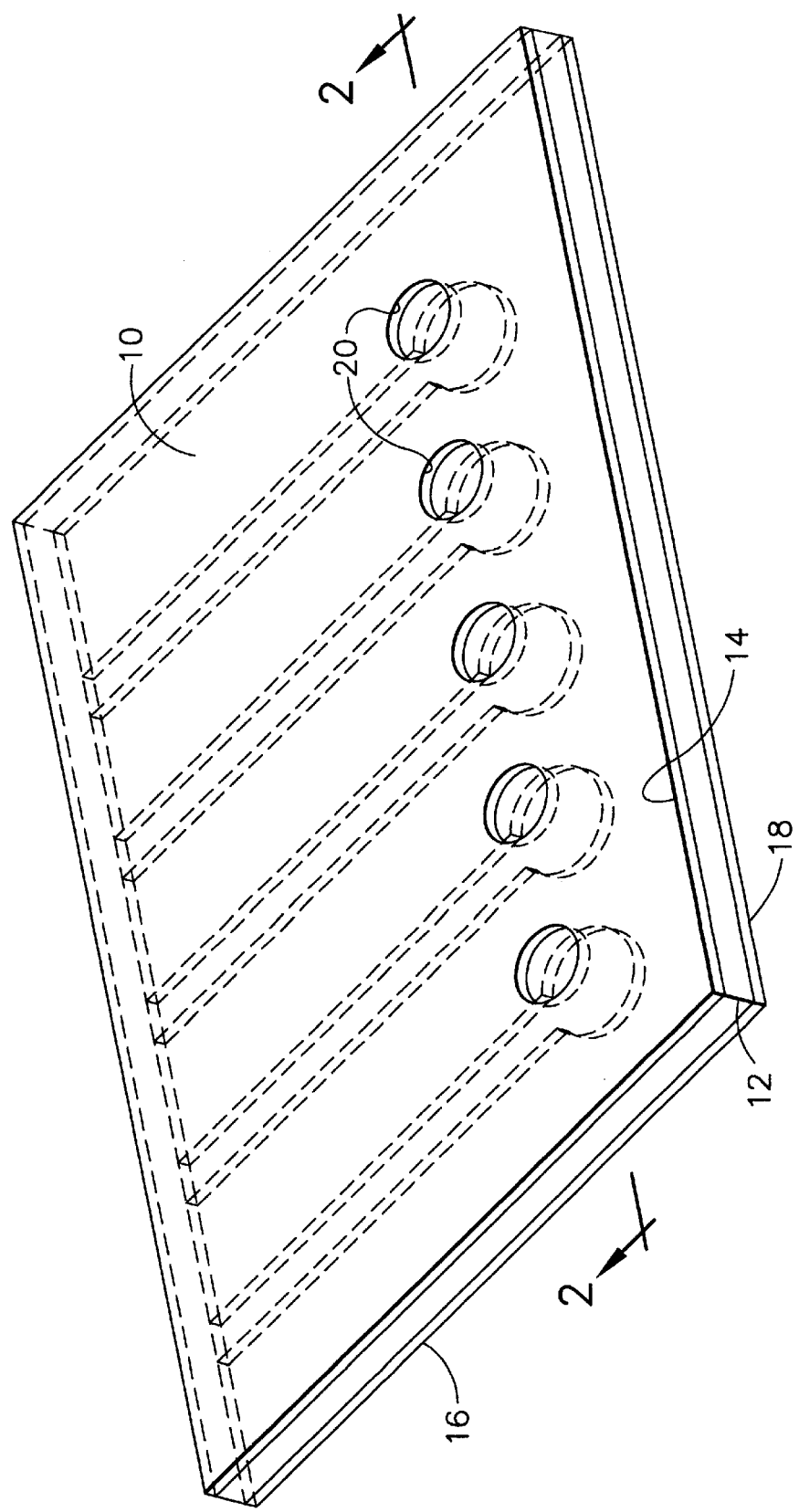
FIG. 1 illustrates an electroformed substrate with a photoresist pattern, prior to electroforming.

Electrical contact pads which are raised above the plane of the rest of the charge plate can be formed by applying the following changes to the basic charge plate fabrication process described above. During the photolithographic stage, used to define the charge leads, a photoresist layer 10 is applied to back side 14 of substrate 12, in addition to photoresist layer 16 on front side 18. Using an appropriate (additional) photomask 10, which is aligned to the photomask 16 for the front side 18, a photoresist pattern is defined on the back side 14 of the coupon, as is illustrated in FIG. 1. The desired pattern covers the entire back side 14 of the coupon with photoresist, except for small open regions 20 which are aligned with the electrical contact pads areas 22 in the front side 18 of the coupon. A cover layer could be applied over the conductive leads of the circuit, for example to provide insulation.

Figure 2A:
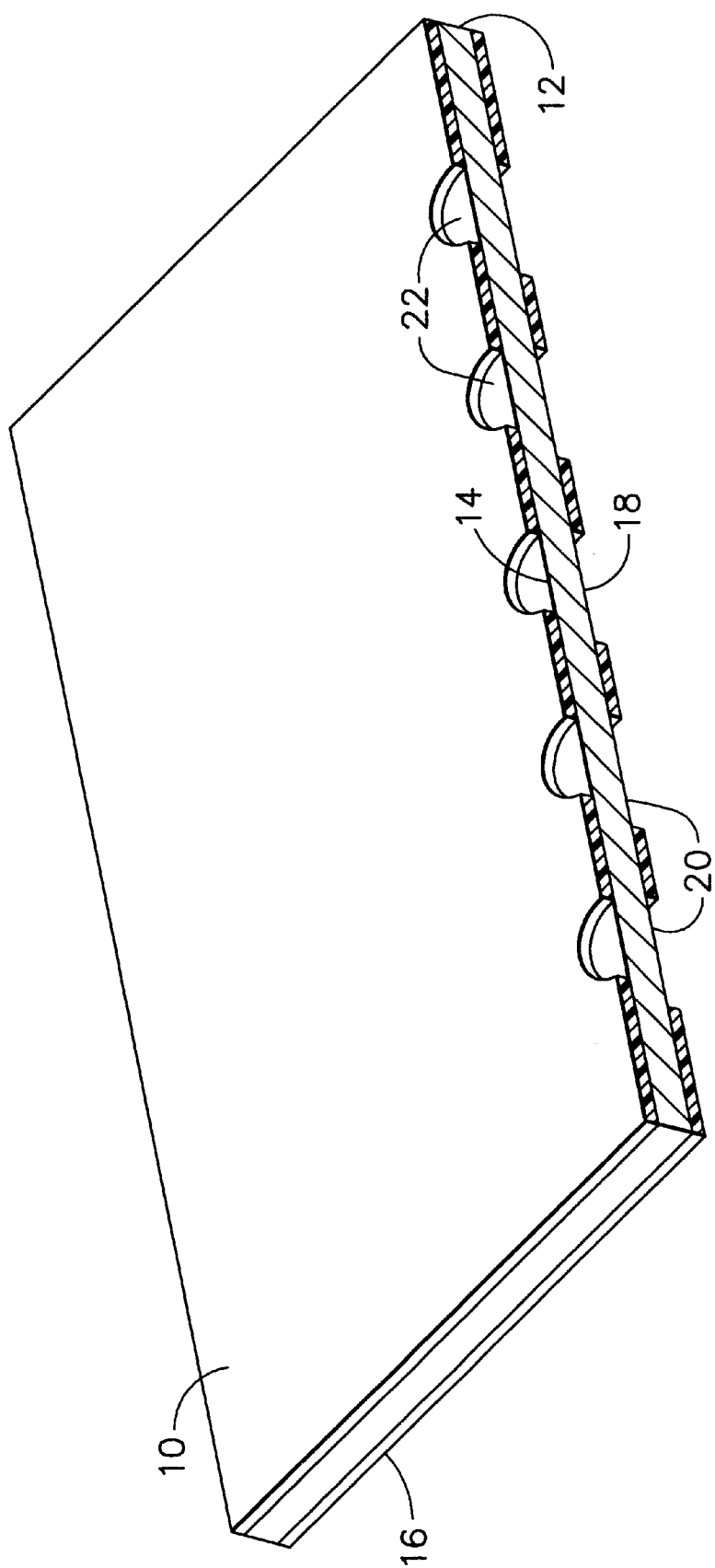
FIG. 2A is a cutaway view along line 2—2 of FIG. 1.
Figure 2B:
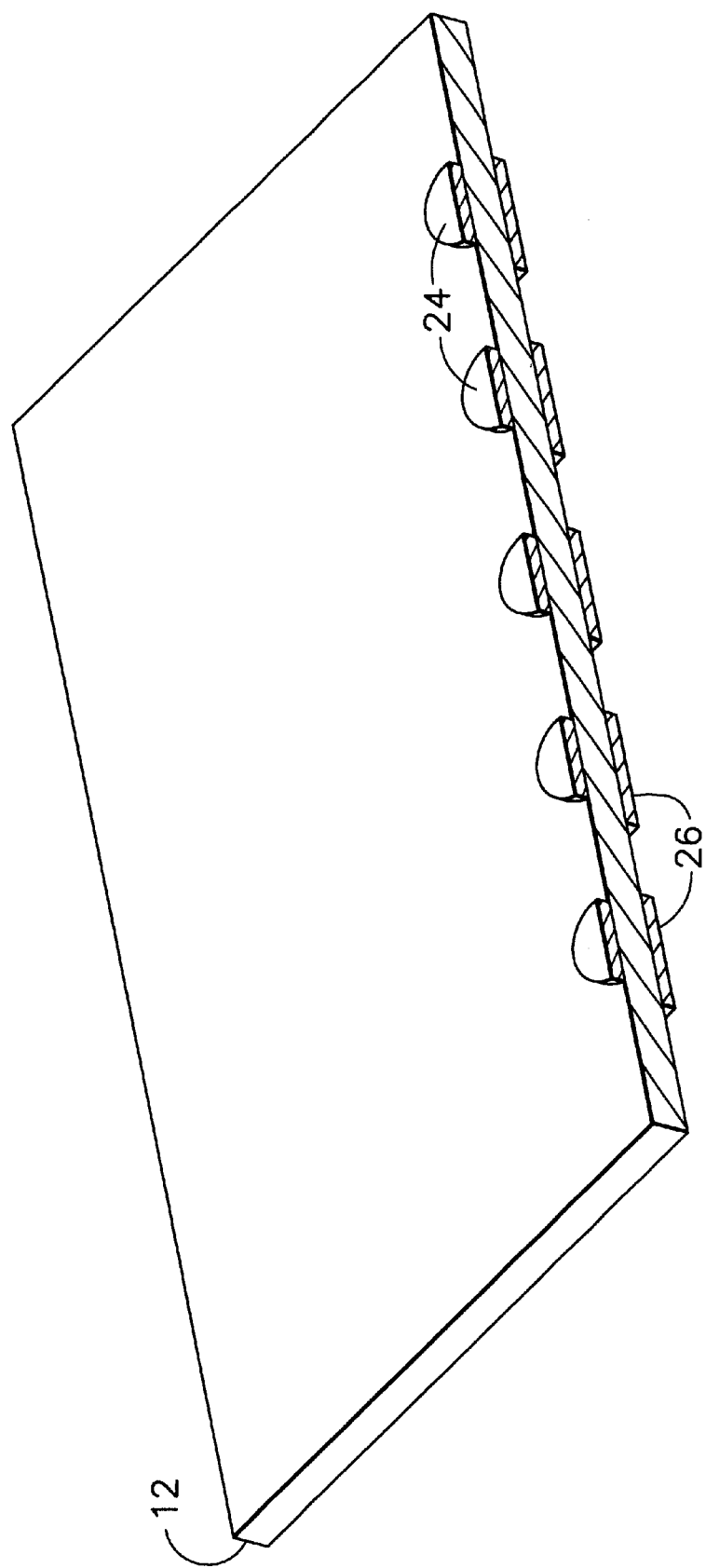
FIG. 2B is a cutaway view along line 2—2 of FIG. 1, illustrating the electroforming after removal of the photoresist layer.

This photoresist pattern on the back side 10 of the coupon prevents the electroforming of metal on the back side of the coupon, except for the small open regions 20. FIG. 2A illustrates the open areas 20 and 22 for electroforming the etch mask and the electrode pattern. After the front and back sides of the coupon have been electroformed, the photoresist is removed from both sides of the coupon, leaving an electroformed etch mask 24 opposite electroformed electrodes 26, as is illustrated in FIG. 2B.

Figure 3:
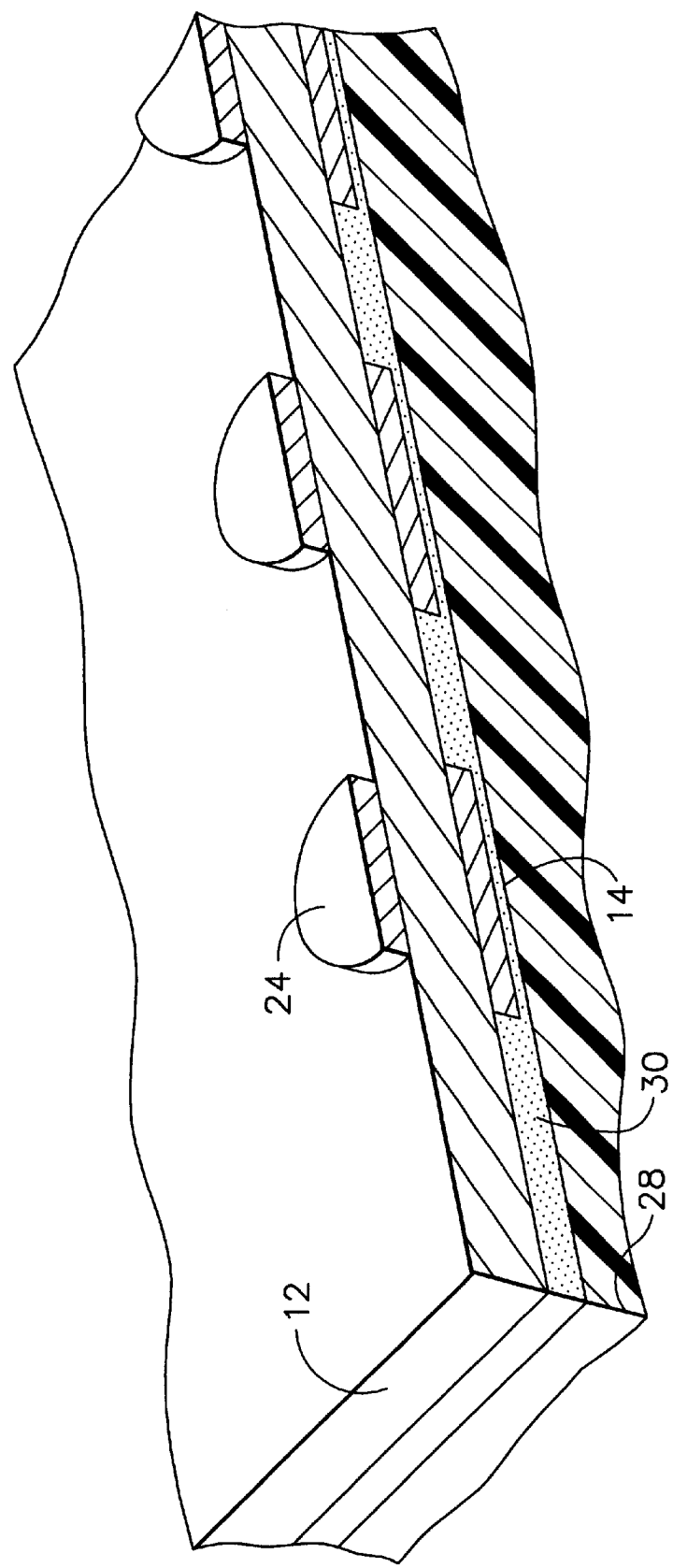
FIG. 3 is an enlarged, cutaway view illustrating post-lamination and before the electroforming substrate is etched away.

As in the prior art charge plate fabrication process, the coupon is bent in a jig at approximately a 90° angle. Using a suitable adhesive, such as an epoxy, the coupon is laminated to the non-conductive charge plate. As illustrated in FIG. 3, the side of the conductive electroforming electroforming substrate 12 with the electroformed electrode pattern 26 is bonded to the charge plate substrate 28 by means of the adhesive layer 30.

After lamination, the conductive electroforming substrate 12, which is typically a copper alloy, is etched away by suitable processes such as are well known in the art. The metal, which was electroformed on the back side of the coupon, typically a lead-based solder or nickel, is not attacked by the etchant and serves as the etch mask 24. As a result, while the bulk of the electroforming substrate is etched away, the copper alloy under the etch mask is not. As shown in FIG. 4, pillars 32 are formed by the those portions of the electroforming substrate which were capped by the etch mask. FIG. 4 further illustrates that due to the undercutting of the etching process, the etch mask extends out beyond that of the pillar formed from the electroforming substrate. This has no detrimental effect on the functioning of this pillar as a pressure-concentration raised bump contact.

These pillars serve as raised bump contact pads on the charge plate. With raised bumps on the charge plate, the flex cable which mates with the charge plate no longer need to include raised bumps to concentrate clamping forces at the contact pads. Using suitable clamping means to hold the flex cable in contact with the raised bump contacts of the charge plate, reliable electrical connections can be made to the charge plate. If desired, the raised contacts can be plated with a noble metal such as gold to increase reliability.

For the fabrication of these raised bump contacts, the preferred thickness of the copper alloy substrate used for electroforming is 0.004 in, but thicknesses from about 0.002 to 0.006 inch may be used. For substrates thinner than approximately 0.002 inch the raised bumps lack the desired thickness. Substrates thicker than approximately 0.006 inch suffer from excessive undercutting during the etch process. In this regard it should be noted that the substrate is etched laterally under the etch mask at about the same rate as it is etched down into the substrate. Therefore due to the undercutting, the width of the etch mask which is unsupported by the remaining substrate pillar is about equal to the thickness of the substrate.

An alternate form of raised contacts can be made by overetching the substrate, as illustrated in FIG. 5. By appropriately overetching the substrate, the pillars can no longer support the etch mask. The result is a sharply pointed 34 raised contact pad 14.

Figure 6:
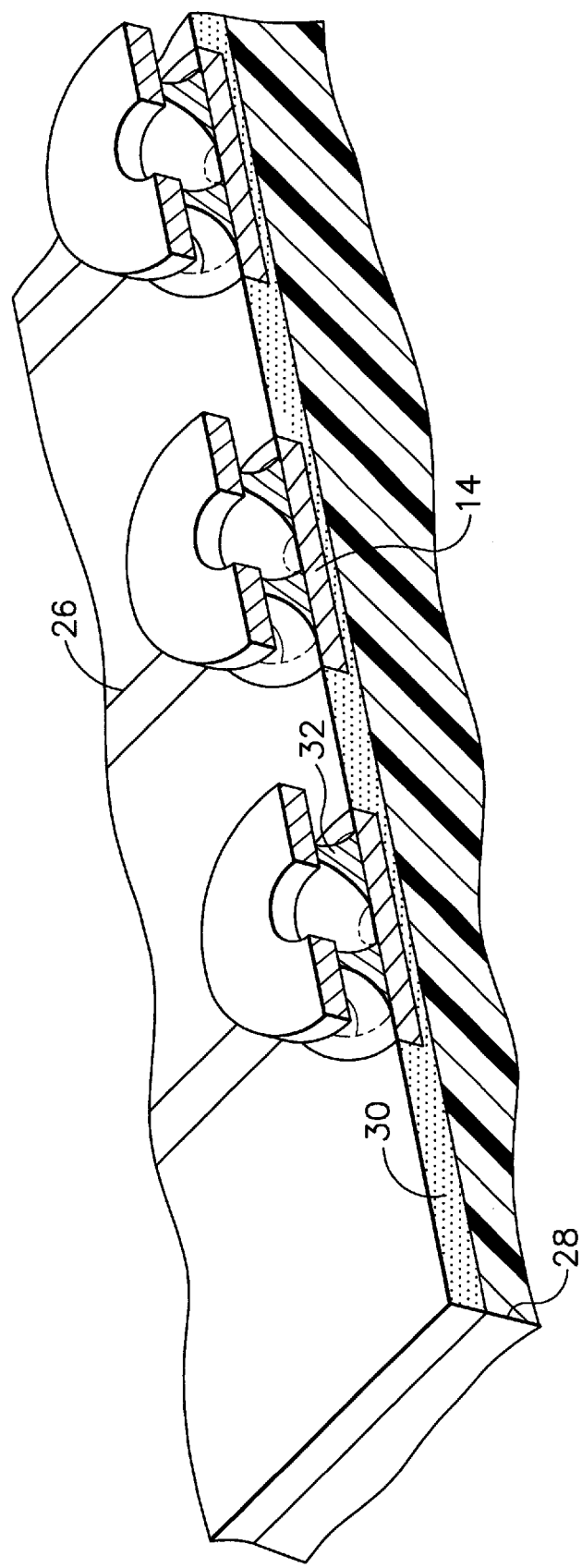
FIG. 6 is an enlarged cutaway view as in FIG. 5, after etching, with a ring-like raised contact to interlock with a raised bump of the mating part.
Figure 7:
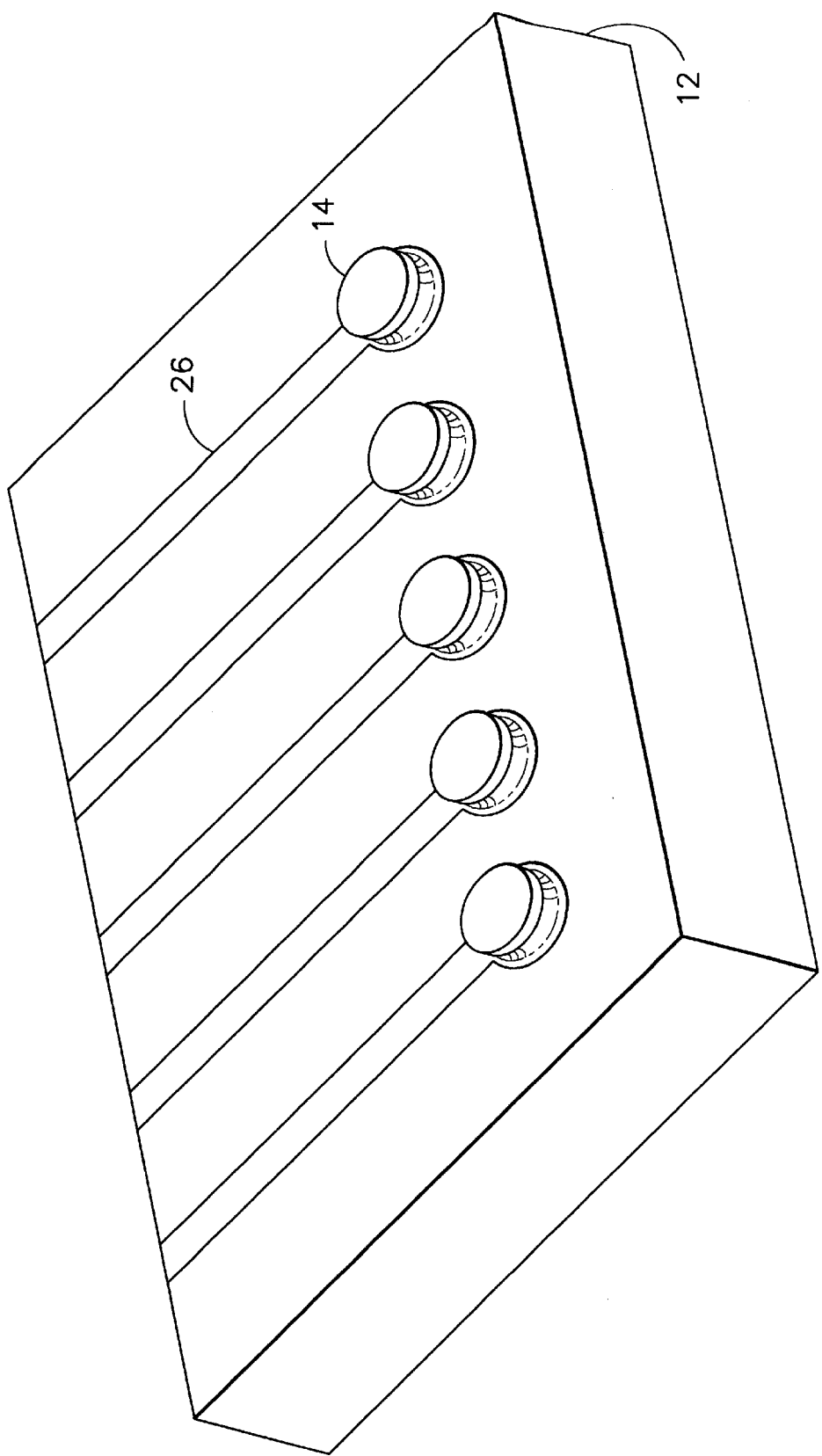
FIG. 7 is an isometric view of a charge plate with raised contact pads.

While the illustrations show circular raised bumps contact pads, other shapes can be used for the contact pads. In one embodiment, the raised contact pad on the charge plate is in the shape of a raised ring, as shown in FIG. 6. These are produced by means of an etch mask having ring-shaped patterns aligned opposite from the contacts of the electroformed electrode pattern. By allowing etching to take place through the center of the ring, a ring-shaped raised contact can be formed. When used with a cone shaped raised contact on the flex cable, the cone shaped contact can nest securely inside the ring. The interlocking nature of the contact pads on the mating circuits can reduce the risk of the contacts becoming misaligned during operation. This invention therefore provides a simplified means to construct interlocking contact pads over the prior art methods described in U.S. Pat. Nos. 5,342,207 and 5,415,555.

As mentioned above, the etch mask is typically electroformed nickel or a lead-based solder. Functionally, the etch mask can be any material which is not etched by the etchants employed to etch the electroforming substrate. As the electrode structure is typically electroformed of the Nickel, it is convenient to electroform the etch mask of the same material. It is possible then to electroform the etch mask concurrently with the electrode pattern. If the plated etch mask material is a lead-based solder, this can subsequently be reflowed to coat the top of the copper alloy pillar 32. This would allow soldered electrical connections to be made, if desired. The tendency of the solder to flow from contact to contact, when the mating circuits are reflow soldered together, is greatly reduced by these raised contacts. As a result, solder connections can be made at higher densities than with the prior art.

The description above details the means for fabricating raised bump contacts on the charge plate. In accordance with the teachings of the present invention, a like-process may be employed to fabricate raised bump flexible circuits. As with the procedure above, an electrode pattern and etch mask pattern are electroformed on the two sides of a metal substrate, typically copper. The substrate with the electroformed electrodes and etch mask is laminated to a non conductive polymeric sheet, such as Kapton, rather being bent and laminated to a rigid ceramic base. After lamination, the copper electroforming substrate is etched away except for the areas under the etch mask. The resulting flexible circuit has raised contacts formed from the pillars of the copper substrate topped by the etch mask.

This process for fabricating raised bump contacts on flexible circuits is simpler and more reliable than the process as outlined in U.S. Pat. No. 4,125,310. In the '310 patent, an etch mask and an etching process were also employed. In that process, the electrical circuits were defined by the etching process. Variations in etch rate across the piece make the resulting circuits prone to failure due to shorts, caused by insufficient etching, or failure due to opens, caused by excessive etching. In the present invention, the circuitry is defined by the electroformed electrode structure, not by the etched substrate. The substrate left after etching is limited to the contact area in the present invention. As the contact pads tend to be more widely spaced than the bulk of the circuit traces, the process is much less sensitive to variations in the etching than the prior art.

Raised bump flex cables have also been made by electroforming processes such as are described in U.S. Pat. Nos. 5,364,277 and 5,307,561. These patents electroform electrode patterns on conductive substrates which contain depressions corresponding to the raised bump contacts. The electroformed metal replicates the depressions in the substrate. The electroformed electrode structure is then laminated to a polymer sheet, such as a Kapton. The Kapton and the laminated electrode structure are then peeled from the electroform mandrel. Once removed from the mandrel the replicated depressions of the mandrel now form raised contacts. The peeling operation employed in this prior art has been found to produce significant stresses in the circuit which can produce failures. The present invention eliminates the high stress peeling operation which can produce failures in the prior art. It also does not require the forming of depressions in the electroforming substrate to produce the raised bumps.

INDUSTRIAL APPLICABILITY AND ADVANTAGES

The present invention is useful in the field of ink jet printing, and has the advantage of providing for reliable spring force electrical contacts on an ink jet charge plate. An additional advantage of the present invention is to provide a pressure contact, to allow achievement of correct pressure in finer pitch assemblies. Yet another advantage of the present invention is that it provides a method of forming aligned contact pads which also aids in solder connection if so desired.

The invention has been described in detail with particular reference to certain preferred embodiments thereof, but it will be understood that modifications and variations can be effected within the spirit and scope of the invention.

What is claimed is:

1. A method for promoting improved electrical connection between an ink jet charge plate having charge plate circuitry, and associated charge leads, the method comprising the steps of: x providing a charge plate coupon on the ink let charge plate on a side opposite the charge plate circuitry;

plating an etch mask on the charge plate coupon;

etching away a majority of the charge plate coupon and preserving small portions between a termination pad of the charge plate coupon and the etch mask, to form at least one bump; and using the at least one bump formed to provide a high pressure point electrical connection to the charge plate.

2. A method as claimed in claim 1 wherein the etch mask comprises a nickel etch mask.

3. A method as claimed in claim 1 wherein the etch mask comprises a solder etch mask.

4. A method as claimed in claim 1 wherein the step of etching away the charge plate coupon further comprises the step of initially laminating the charge plate to a dielectric substrate.

5. A method as claimed in claim 1 wherein the charge plate coupon comprises a copper alloy charge plate coupon.

6. A method as claimed in claim 1 wherein the charge plate coupon comprises a beryllium copper charge plate coupon.

7. A method as claimed in claim 1 wherein the at least one bump comprises a noble metal coating.

8. A method as claimed in claim 7 wherein the noble metal coating comprises a gold coating.

* * * * *